United States Patent
Cho et al.

(10) Patent No.: US 8,711,055 B2
(45) Date of Patent: Apr. 29, 2014

(54) PRINTED CIRCUIT BOARD INCLUDING ELECTROMAGNETIC BANDGAP STRUCTURE

(75) Inventors: Won Woo Cho, Busan (KR); Dek Gin Yang, Chungcheongbuk-do (KR); Myung Gun Chong, Gyeongsangnam-do (KR); Jung Soo Kim, Gyunggi-do (KR); Hyung Ho Kim, Incheon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 1083 days.

(21) Appl. No.: 12/650,482

(22) Filed: Dec. 30, 2009

(65) Prior Publication Data

US 2010/0328178 A1  Dec. 30, 2010

(30) Foreign Application Priority Data

Jun. 24, 2009 (KR) ................. 10-2009-0056534
Nov. 3, 2009 (KR) ................. 10-2009-0105670

(51) Int. Cl.
*H01Q 15/02* (2006.01)

(52) U.S. Cl.
USPC ............................................. 343/909

(58) Field of Classification Search
USPC .................... 343/905, 909; 333/12
See application file for complete search history.

(56) References Cited

U.S. PATENT DOCUMENTS

2005/0029632 A1* 2/2005 McKinzie et al. ............ 257/665
2010/0214178 A1* 8/2010 Toyao et al. .................. 343/702

FOREIGN PATENT DOCUMENTS

| JP | 2008-283381 | 11/2008 |
| KR | 100838246 | 6/2008 |
| KR | 10-2009-0014950 | 2/2009 |

OTHER PUBLICATIONS

Inclan-Sanchez, L.; Vazquez-Roy, J.-L.; Rajo-Iglesias, E., "Diplexed dual-polarization proximity coupled patch antenna," Antennas and Propagation Society International Symposium, 2007 IEEE , vol., No., pp. 2061,2064, Jun. 9-15, 2007.*
English summary and Office Action from counterpart Korean Patent Application No. 10-2009-0105670, mailed Apr. 26, 2011, 7 pages.

* cited by examiner

*Primary Examiner* — Robert Karacsony
(74) *Attorney, Agent, or Firm* — Bracewell & Giuliani LLP; Brad Y. Chin

(57) ABSTRACT

Disclosed is a printed circuit board, which includes an electromagnetic bandgap structure disposed around an antenna so as to prevent noise from being transmitted to the antenna. The printed circuit board includes an antenna, a circuit chip, a plurality of metal layers and a plurality of dielectric layers, a pair of transmission lines for transmitting a signal to the antenna, and an electromagnetic bandgap structure disposed between the antenna and the circuit chip and for preventing an electromagnetic wave from being transmitted from the circuit chip to the antenna.

8 Claims, 11 Drawing Sheets

PRINTED CIRCUIT BOARD INCLUDING ELECTROMAGNETIC BANDGAP STRUCTURE

CROSS REFERENCE TO RELATED APPLICATION

This application claims the benefit of Korean Patent Application No. 10-2009-0056534, filed Jun. 24, 2009, entitled "Printed circuit substrate using the electromagnetic bandgap", and Korean Patent Application No. 10-2009-0105670, filed Nov. 3, 2009, entitled "Printed circuit substrate using the electromagnetic bandgap", which are hereby incorporated by reference in its entirety into this application.

BACKGROUND OF THE INVENTION

1. Technical Field

The present invention relates to a printed circuit board (PCB), and more particularly, to a PCB which includes an electromagnetic bandgap structure that is disposed around an antenna so as to prevent noise from being transmitted to the antenna.

2. Description of the Related Art

Recently, as a radio communication device is required to have a large number of different functions, the number of components mounted on the device has increased and the size and thickness of the device have been remarkably reduced, and thus the density of a PCB which is an important component of the device is on a continuously increasing trend.

When the density of the PCB is increased in this way, the distances separating the mounted components become reduced, and accordingly, signal interference occurs therebetween. A signal generated from a component has an influence in the form of noise on another adjacent component.

In particular, depending on an increase in the density of the PCB, a chip component which has been mounted around the antenna may be located nearby the antenna, so that a signal generated from the chip component affects the antenna, undesirably deteriorating performance of the antenna.

Generally, communication is achieved in such a manner that the antenna receives power from the feed line of a main PCB to thus radiate radio frequency to the outside.

In the case where the antenna is a FIFA or loop type antenna, the antenna simultaneously uses the ground and feed terminals of the main PCB. In this way, when the antenna simultaneously uses the ground and feed terminals of the main PCB, noise generated from the RF circuit or digital circuit of the main PCB propagates to the inside or outside of the PCB and thus affects a radio frequency output, consequently deteriorating performance of the antenna in the frequency band affected by noise.

Because noise has a direct or indirect influence on antenna performance along the feed or ground line of the antenna, even when the antenna is differently designed, there is a limitation on an improvement in its performance.

Although such noise may be blocked using a passive element or an L/C filer, in the case where the propagation pathway of noise cannot be exactly determined, design lead time may be increased, undesirably resulting in high cost.

Specifically, in the case where the propagation pathway of noise is unclear, many designs for blocking noise should be reexamined, and thus the lead time is increased, undesirably causing a problem of increasing the cost.

Furthermore, when the pathway of noise varies depending on changes in antenna design or a new noise source may be created, antenna performance may deteriorate as a result.

SUMMARY OF THE INVENTION

Accordingly, the present invention has been made keeping in mind the problems encountered in the related art and the present invention intends to provide a PCB including an electromagnetic bandgap structure in order to prevent performance of an antenna from being deteriorated due to noise inside the PCB.

An aspect of the present invention provides a PCB including an antenna, a circuit chip, a plurality of metal layers and a plurality of dielectric layers, a pair of transmission lines for transmitting a signal to the antenna, and an electromagnetic bandgap structure disposed between the antenna and the circuit chip in the PCB and for preventing an electromagnetic wave from being transmitted from the circuit chip to the antenna.

In the aspect, the circuit chip may be an analog circuit chip for transmitting the signal to the antenna, and the electromagnetic wave transmitted from the circuit chip to the antenna may be an electromagnetic wave caused by an operating frequency and harmonic components of the circuit chip.

In the aspect, the circuit chip may be a digital circuit chip, and the electromagnetic wave transmitted from the circuit chip to the antenna may be an electromagnetic wave caused by an operating frequency and harmonic components of the circuit chip.

In the aspect, one of the pair of transmission lines may be formed in a first metal layer of the plurality of metal layers so as to transmit the signal to the antenna, and the electromagnetic bandgap structure may include a plurality of metal plates spaced apart from the one of the pair of transmission lines in a direction of the antenna, and a plurality of vias for connecting the one of the pair of transmission lines and the metal plates to each other, in which sets of the metal plates and the vias are periodically arranged at a predetermined interval.

In the aspect, the other of the pair of transmission lines may be formed in a second metal layer of the plurality of metal layers which is spaced apart from the first metal layer in a direction of the antenna, and the metal plates may be formed in the second metal layer.

In the aspect, the one of the pair of transmission lines may be a ground plate, and the other of the pair of transmission lines may be a feed line.

In the aspect, the other of the pair of transmission lines may be formed in a second metal layer of the plurality of metal layers which is spaced apart from the first metal layer in a direction of the antenna, and the metal plates may be formed between the first metal layer and the second metal layer.

In the aspect, the one of the pair of transmission lines may be a ground plate, and the other of the pair of transmission lines may be a feed line.

In the aspect, the other of the pair of transmission lines may be formed around the one of the pair of transmission lines on the first metal layer.

In the aspect, the one of the pair of transmission lines may be a feed line, and the other of the pair of transmission lines may be a ground plate.

In the aspect, the PCB may further include an organic titanium coating layer formed on an outer surface of each of the metal plates.

In the aspect, a pad for electrically connecting the antenna and the transmission line to each other may be provided at a surface of the antenna, and the plurality of metal plates of the electromagnetic bandgap structure may be periodically arranged so as to enclose the pad.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Hereinafter, a detailed description will be given of a PCB including an electromagnetic bandgap structure according to embodiments of the present invention with reference to the accompanying drawings.

Figure 1:
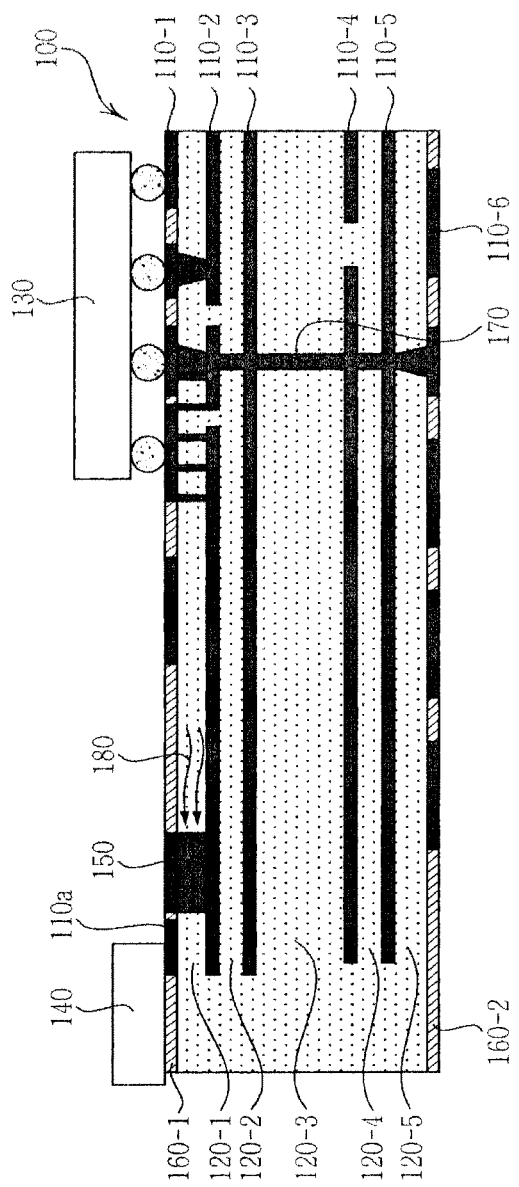
FIG. 1 is a cross-sectional view showing a PCB including an electromagnetic bandgap structure according to an embodiment of the present invention.

FIG. 1 is a cross-sectional view showing a PCB including an electromagnetic bandgap structure according to an embodiment of the present invention.

With reference to FIG. 1, a PCB 100 using an electromagnetic bandgap structure 150 according to the embodiment of the present invention includes metal layers 110-1, 110-2, 110-3, 110-4, 110-5, 110-6 (hereinafter, collectively referred to as "110"), dielectric layers 120-1, 120-2, 120-3, 120-4, 120-5 (hereinafter, collectively referred to as "120") disposed between the metal layers 110, a circuit chip 130 mounted on the first upper metal layer 110-1, an antenna 140 mounted on the first upper metal layer 110-1 and spaced apart from the circuit chip 130, an electromagnetic bandgap structure 150 disposed between the circuit chip 130 and the antenna 140 and between the first upper metal layer 110-1 and the second upper metal layer 110-2 (or between the first upper metal layer 110-1 and the third upper metal layer 110-3), and solder resists 160-1, 160-2 respectively formed in the first upper metal layer 110-1 and the lowermost metal layer 110-6.

Supposing that the metal layer 110-3 is a ground layer and the metal layer 110-4 is a power layer, current flows through a via 170 connected between the ground layer 110-3 and the power layer 110-4, and the PCB 100 performs a predetermined operation or function.

The metal layer 110-1 includes a pad 110a for electrically connecting the antenna 140 and the metal layer to each other.

The pad 110a formed in the metal layer 110-1 may be a feed pad or a ground pad. In the case where the metal layer 110-1 includes a feed line as a transmission line, the feed line contained in the metal layer 110-1 is connected to the antenna 140 through a feed pad.

In the case where the metal layer 110-1 includes the feed line as above, the metal layer 110-2 or 110-3 may include a ground line (or a ground plate) as a transmission line. In this case, the ground line is electrically connected to the antenna 140 through a via (not shown) and the ground pad.

In addition, the metal layer 110-1 or the metal layer 110-2 or 110-3 may include both the ground line and the feed line as transmission lines.

Like this, when the antenna 140 simultaneously uses the feed line and the ground line which are a pair of transmission lines in the same PCB 100, an electromagnetic wave 180 caused by an operating frequency and harmonic components of the circuit chip 130 is transmitted to between the ground line and the feed line of the antenna 140, undesirably causing a mixed signal problem.

The mixed signal problem means disturbing an accurate operation of the antenna 140 because the electromagnetic wave from the circuit chip 130 has a frequency within the operating frequency band of the antenna 140.

For example, when the antenna 140 transmits or receives a predetermined frequency signal, the electromagnetic wave 180 including the predetermined frequency signal may be transmitted from the circuit chip 130, making it difficult to accurately transmit or receive the signal.

In order to solve such a mixed signal problem, in the present invention, the electromagnetic bandgap structure 150 is mounted between the circuit chip 130 and the antenna 140 and also between the metal layer 110-1 having the feed line and the metal layer 110-2 or 110-3 having the ground line, thus blocking the transmission of the mixed signal to the antenna 140 from the circuit chip 130.

The circuit chip 130 may be an RF analog circuit chip directly connected to the antenna 140 through the feed line or a digital circuit chip indirectly connected to the antenna 40 through the RF analog circuit chip.

In the case of the digital circuit chip, it is not directly connected to the antenna 140 as in the RF analog circuit chip, and thus may reduce an effect of noise on the antenna 140.

However, the digital circuit chip deals with signals 0 and 1, and the influence of frequency is not negligible because the frequency falls within a high frequency band.

For this reason, in order to block noise between the antenna 140 and the digital circuit chip, the bandgap structure may be mounted therebetween.

Specifically, the bandgap structure may be provided between the antenna 140 and the analog circuit chip and/or between the antenna 140 and the digital circuit chip.

Figure 2:
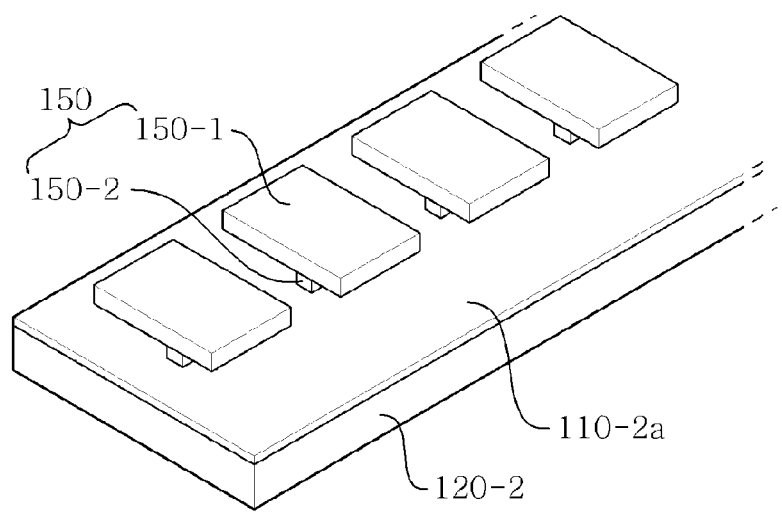
FIG. 2 is a perspective view showing the electromagnetic bandgap structure of FIG. 1.
Figure 3:
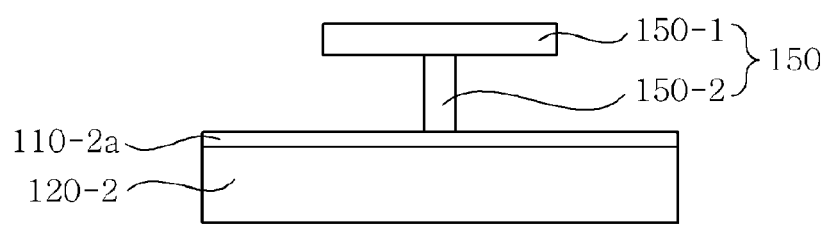
FIG. 3 is a cross-sectional view showing a unit of the electromagnetic bandgap structure of FIG. 1.
Figure 4:
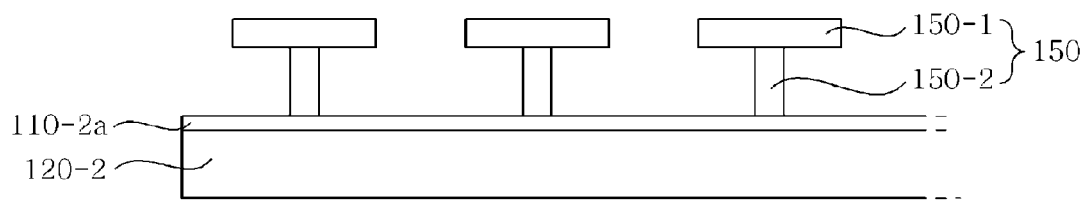
FIG. 4 is a cross-sectional view showing a unit array of the electromagnetic bandgap structure of FIG. 1.
Figure 5:
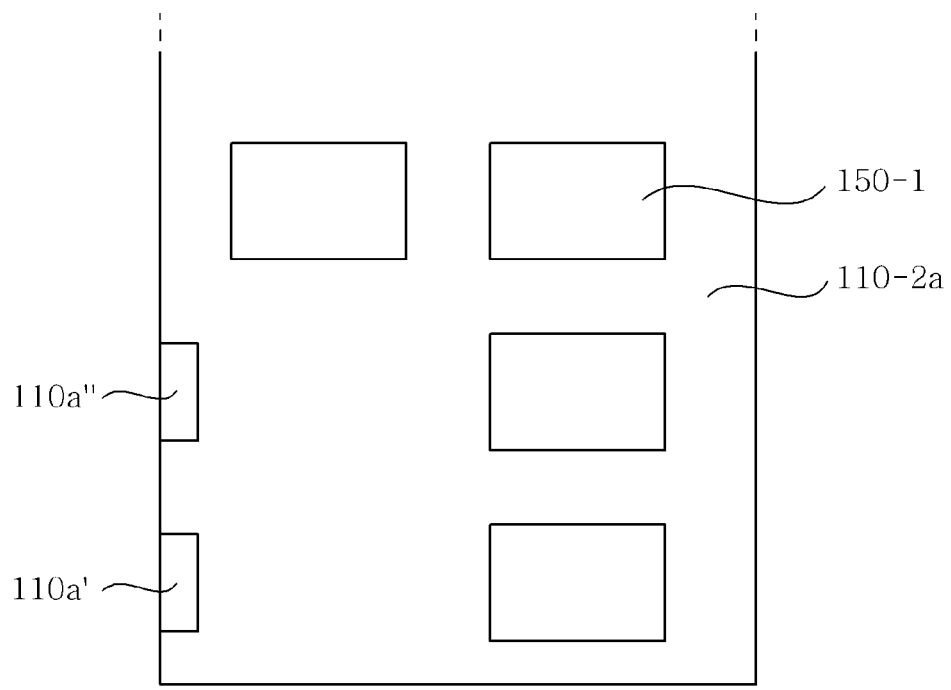
FIG. 5 is a top plan view showing the unit array of the electromagnetic bandgap structure of FIG. 1.

FIG. 2 is a perspective view showing the electromagnetic bandgap structure of FIG. 1, FIG. 3 is a cross-sectional view showing a unit of the electromagnetic bandgap structure of FIG. 1, FIG. 4 is a cross-sectional view showing a unit array of the electromagnetic bandgap structure of FIG. 1, and FIG. 5 is a top plan view showing the unit array of the electromagnetic bandgap structure of FIG. 1.

With reference to FIGS. 2 to 5, the electromagnetic bandgap structure according to the embodiment of the present invention includes metal plates 150-1 formed in the first upper metal layer 110-1 and vias 150-2 formed in the upper dielectric layer 120-1, and is formed on the ground plate (or ground line) 110-2*a* which is the transmission line formed in the second upper metal layer 110-2.

The ground plate 110-2*a* is formed on the dielectric layer 120-2 and thus provides a ground for the transmitted or received signal of the antenna 140.

The metal plates 150-1 are spaced apart from the upper surface of the ground plate 110-2*a*. The metal plates 150-1 may be provided in the form of a rectangular parallelepiped or a thin film, and are formed away from the ground plate 110-2*a*.

As such, the metal plates 150-1 are disposed to face the ground plate 110-2*a*, thus making it possible to form capacitance between the metal plates 150-1 and the ground plate 110-2*a*.

The metal plates 150-1 may be formed of the same metal as that of the ground plate 110-2*a*, thus enabling signal transmission.

The vias 150-2 connect the ground plate 110-2*a* and the metal plates 150-1 to each other. Specifically, the vias 150-2 extend perpendicularly from the ground plate 110-2*a* so that one end of each via is connected to the center of the metal plates 150-1.

The vias 150-2 may be formed of the same metal as that of the ground plate 110-2*a*. In this case, the vias 150-2 enable the signal or structural connection between the ground plate 110-2*a* and the metal plates 150-1.

In the electromagnetic bandgap structure, the metal plates 150-1 and the vias 150-2 constitute respective units, and these units are periodically arranged at predetermined intervals. As shown in the top plan view of FIG. 5, the units are periodically arranged so as to enclose the feed pad 110*a*' and the ground pad 110*a*" formed in the first upper metal layer 110-1, thus blocking the transmission of an electromagnetic wave from the circuit chip 130. Herein, a periodic array indicates that the units are repeatedly arranged at predetermined intervals. Thus, the distances between the units need not be uniform.

Furthermore, the dimension (e.g. interval, area or thickness) of the units may vary and may be appropriately adjusted.

Although the formation of the electromagnetic bandgap structure between the first upper metal layer 110-1 and the second upper metal layer 110-2 is illustrated, the present invention is not limited thereto. Alternatively, the electromagnetic bandgap structure may be formed between the other metal layer and the dielectric layer.

Figure 6:
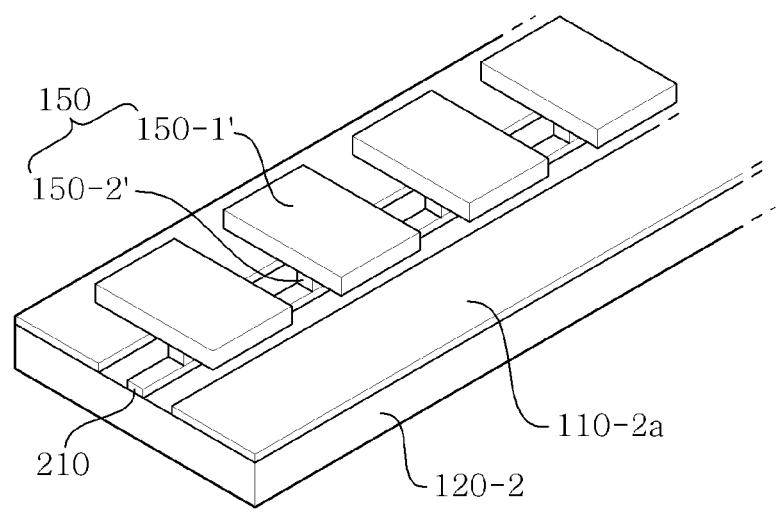
FIG. 6 is a perspective view showing an electromagnetic bandgap structure according to another embodiment of the present invention.
Figure 7:
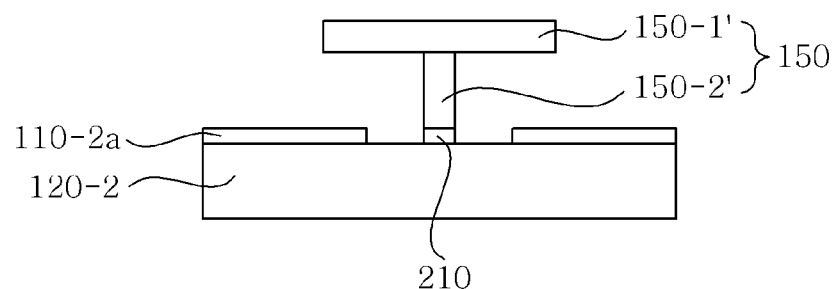
FIG. 7 is a cross-sectional view showing a unit of the electromagnetic bandgap structure of FIG. 6.
Figure 8:
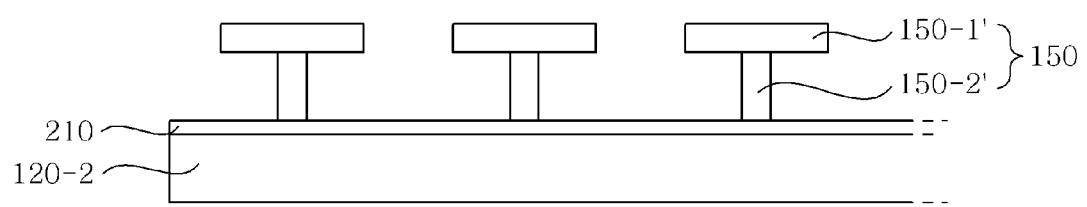
FIG. 8 is a cross-sectional view showing a unit array of the electromagnetic bandgap structure of FIG. 6.
Figure 9:
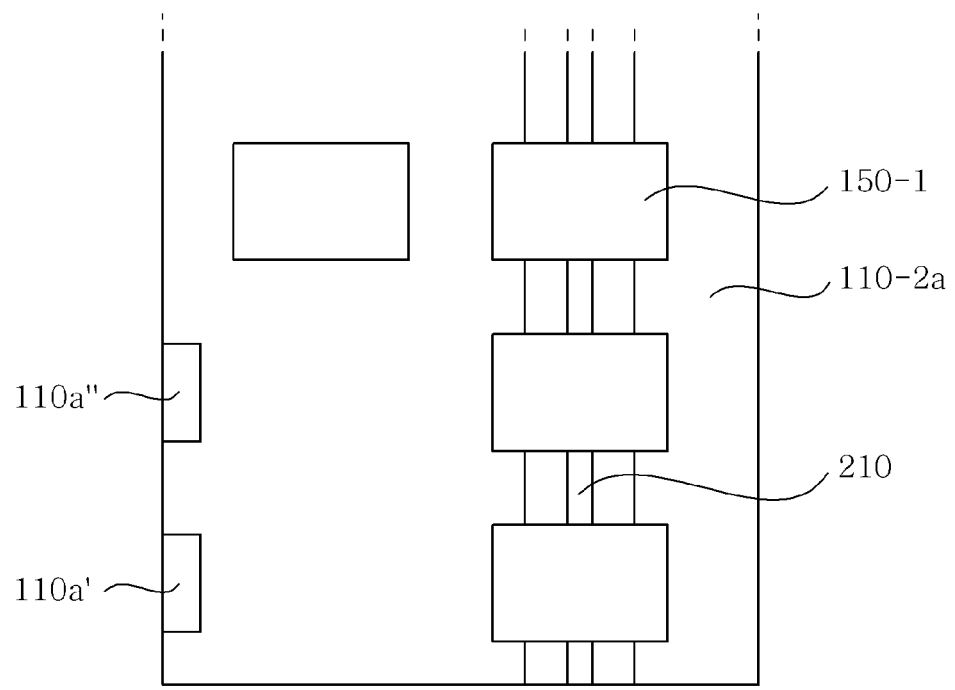
FIG. 9 is a top plan view showing the unit array of the electromagnetic bandgap structure of FIG. 6.

FIG. 6 is a perspective view showing an electromagnetic bandgap structure according to another embodiment of the present invention, FIG. 7 is a cross-sectional view showing a unit of the electromagnetic bandgap structure of FIG. 6, FIG. 8 is a cross-sectional view showing a unit array of the electromagnetic bandgap structure of FIG. 6, and FIG. 9 is a top plan view showing the unit array of the electromagnetic bandgap structure of FIG. 6. In this embodiment, a feed line and a ground line are present in the same plane.

With reference to FIGS. 6 to 9, the electromagnetic bandgap structure according to another embodiment of the present invention includes metal plates 150-1' formed in a first upper metal layer 110-1 and vias 150-2' formed in an upper dielectric layer 120-1, and is formed on a feed line 210 which is a transmission line. The feed line 210 is formed on a dielectric layer 120-2 and transmits a signal. The signal passing through the feed line 210 may become an electromagnetic wave having high frequency.

The metal plates 150-1' are spaced apart from the upper surface of the feed line 210. The metal plates 150-1' may be provided in the form of a rectangular parallelepiped or a thin film, and are formed away from the feed line 210 and the ground plate 110-2*a* formed in the second upper metal layer 110-2.

The metal plates 150-1' may be disposed so that partial surfaces thereof face the ground plate 110-2*a*, thus making it possible to form capacitance between the metal plates 150-1' and the ground plate 110-2*a*.

The metal plates 150-1' may be formed of the same metal as that of the feed line 210, thus enabling signal transmission.

The vias 150-2' connect the feed line 210 and the metal plates 150-1' to each other. Specifically, the vias 150-2' extend perpendicularly from the feed line 210 so that one end of each via is connected to the center of the metal plates 150-1'.

The vias 150-2' may also be formed of the same metal as that of the feed line 210. In this case, the vias 150-2' enable the signal or structural connection between the feed line 210 and the metal plates 150-1'.

In the electromagnetic bandgap structure, the metal plates 150-1' and the vias 150-2' constitute respective units, and these units may be periodically arranged at predetermined intervals. As shown in the top plan view of FIG. 9, the units are periodically arranged so as to enclose the feed pad 110*a*' and the ground pad 110*a*" formed in the first upper metal layer 110-1, thus blocking the transmission of an electromagnetic wave from the circuit chip 130. Herein, a periodic array indicates that the units are repeatedly arranged at predetermined intervals. Thus, the distances between the units need not be uniform.

Furthermore, the dimension (e.g. interval, area or thickness) of the units may vary, and may be appropriately adjusted.

Although the formation of the electromagnetic bandgap structure between the first upper metal layer 110-1 and the second upper metal layer 110-2 is illustrated, the present invention is not limited thereto. Alternatively, the electromagnetic bandgap structure may be formed between the other metal layer and the dielectric layer.

Figure 10:
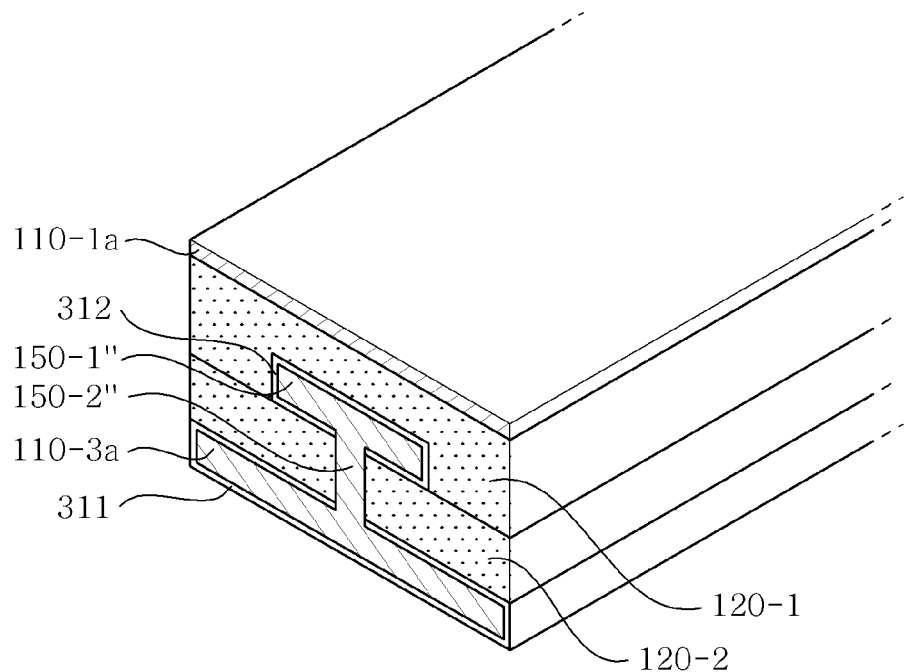
FIG. 10 is a perspective view showing an electromagnetic bandgap structure according to a further embodiment of the present invention.
Figure 11:
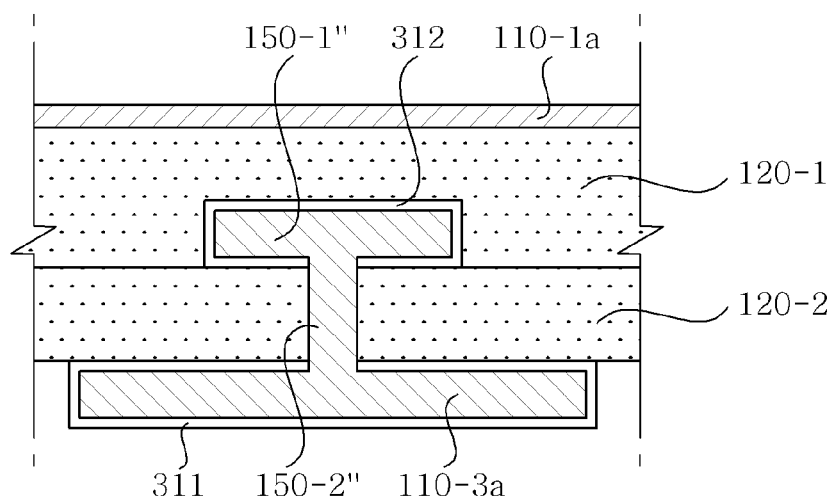
FIG. 11 is a cross-sectional view showing a unit of the electromagnetic bandgap structure of FIG. 10.
Figure 12:
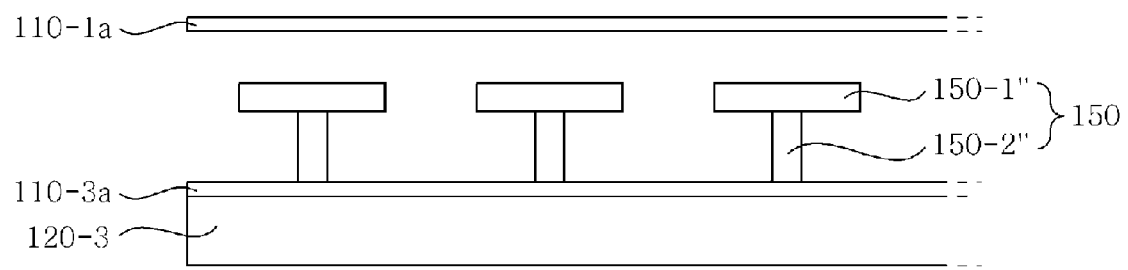
FIG. 12 is a cross-sectional view showing a unit array of the electromagnetic bandgap structure of FIG. 10.
Figure 13:
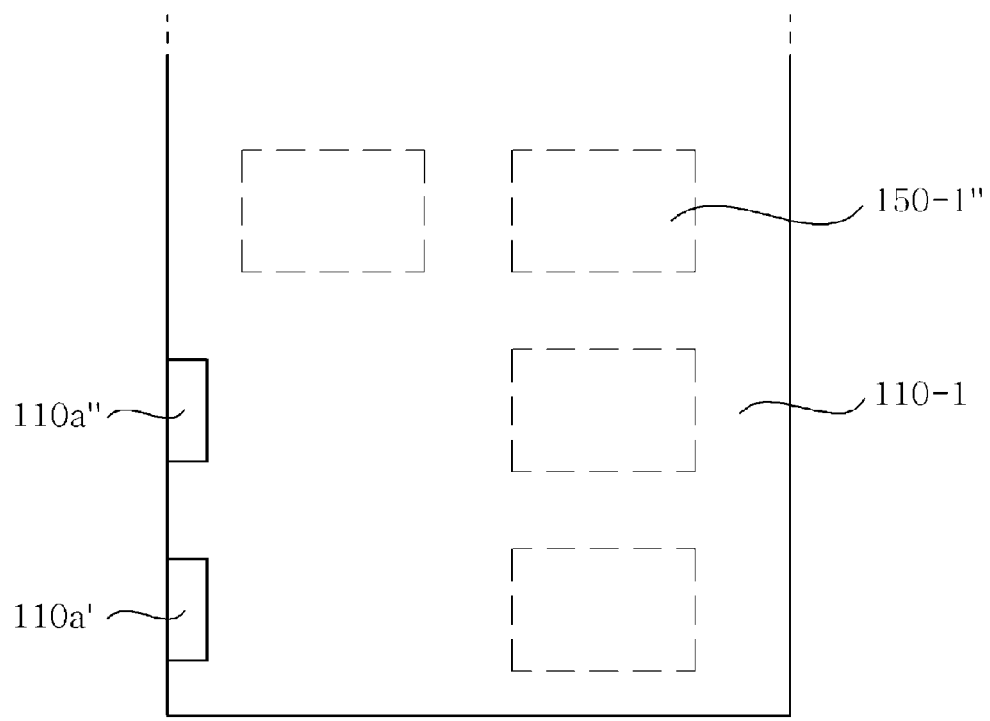
FIG. 13 is a top plan view showing the unit array of the electromagnetic bandgap structure of FIG. 10.

FIG. 10 is a perspective view showing an electromagnetic bandgap structure according to a further embodiment of the present invention, FIG. 11 is a cross-sectional view showing a unit of the electromagnetic bandgap structure of FIG. 10, FIG. 12 is a cross-sectional view showing a unit array of the electromagnetic bandgap structure of FIG. 10, and FIG. 13 is a top plan view showing the unit array of the electromagnetic bandgap structure of FIG. 10. In this embodiment, in the case where a metal layer 110-1 includes a feed line and a metal layer 110-3 includes a ground line (or a ground plate), the electromagnetic bandgap structure may be disposed between the metal layers 110-1, 110-3.

With reference to FIGS. 10 to 13, the electromagnetic bandgap structure according to a further embodiment of the present invention includes metal plates 150-1" formed in a metal layer 110-2, organic titanium coating layers 311, 312, and vias 150-2", and is formed on a ground plate 110-3a which is a transmission line formed in the metal layer 110-3.

The ground plate 110-3a and the metal plates 150-1" are electrically connected to each other using the vias 150-2", and the metal plates 150-1" and the vias 150-2" form respective mushroom type structures.

The first upper metal layer 110-1 includes a feed line 110-1a, and the circuit chip 130 transmits data to the antenna 140 through the feed line 110-1a.

Like this, the mushroom type structures consisting of the metal plates 150-1" and the vias 150-2" may be formed between the ground plate 110-3a and the feed line 110-1a, giving a bandgap structure for blocking a signal included in a predetermined frequency band.

Dielectric layers 120-1, 120-2 may be respectively interposed between the metal plates 150-1" and the feed line 110-1a and between the metal plates 150-1" and the ground plate 110-3a.

The upper dielectric layer 120-1 and the lower dielectric layer 120-2 may be formed of the same dielectric material, or of dielectric materials having different dielectric constants. For example, in order to further lower the bandgap frequency, the upper dielectric layer 120-1 may be formed of a dielectric material having a higher dielectric constant than that of the dielectric material of the lower dielectric layer 120-2.

The thickness of each of the lower dielectric layer 120-2 and the upper dielectric layer 120-1 may be appropriately adjusted so as to obtain the bandgap frequency approximate to an intended bandgap frequency. Specifically, the thickness of the upper dielectric layer 120-1 may be reduced and the thickness of the lower dielectric layer 120-2 may be increased to that extent, and thereby, even when using the electromagnetic bandgap structure having the same size, the bandgap frequency may be controlled to be closer to an intended frequency band. The bandgap frequency means the frequency of an electromagnetic wave that is suppressed from being transmitted from one side of the electromagnetic bandgap structure to the other side thereof.

The mushroom type structures may be repeatedly formed as shown in FIGS. 12 and 13. Specifically, the metal plates are repeatedly disposed, and the vias are formed to equal in number the number of metal plates and are connected thereto in respective units.

Although the metal plates are illustrated in the form of a square shape in FIGS. 10 to 13, they may have other shapes including polygonal such as triangular or hexagonal, circular, or oval shapes.

When the mushroom type structures are repeatedly formed in this way, it is possible to block a signal having a frequency band corresponding to an operating frequency band of the circuit chip among an electromagnetic wave proceeding from the circuit chip to the antenna.

Further, the organic titanium coating layers 311, 312 may be disposed between the metal plates 150-1" and the dielectric layer 120-1 and between the ground plate 110-3a and the dielectric layer 120-2, in order to enhance the adhesivity therebetween in a compression process. The organic titanium coating layers 311, 312 are formed on the surfaces of the metal plates 150-1" and the ground plate 110-3a, and the dielectric layer 120-2 is interposed between the metal plates 150-1" and the ground plate 110-3a, after which compression is performed under conditions of high temperature and high pressure, thereby forming a highly reliable electromagnetic bandgap structure.

In the electromagnetic bandgap structure, the metal plates 150-1" and the vias 150-2" constitute respective units, and these units may be periodically arranged at predetermined intervals. As shown in the top plan view of FIG. 13, the units are periodically arranged so as to enclose the feed pad 110a' and the ground pad 110a" formed in the first upper metal layer 110-1, thus blocking the transmission of the electromagnetic wave from the circuit chip 130. Herein, a periodic array indicates that the units are repeatedly formed at predetermined intervals. Thus, the distances between the units need not be uniform.

In this embodiment, the formation of the electromagnetic bandgap structure between the first upper metal layer 110-1 and the third upper metal layer 110-3 is illustrated, but the present invention is not limited thereto. Alternatively, the electromagnetic bandgap structure may be formed between the other metal layer and the dielectric layer.

Figure 14:
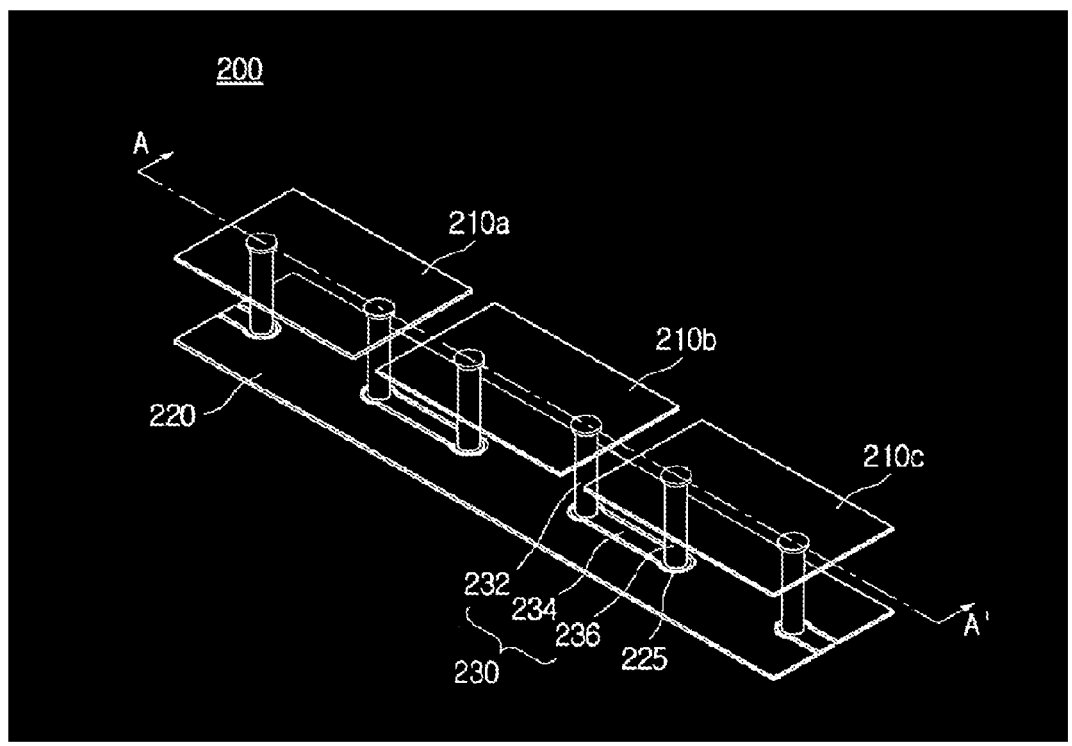
FIG. 14 is a 3-D perspective view showing an electromagnetic bandgap structure in accordance with another embodiment of the present invention.
Figure 15:
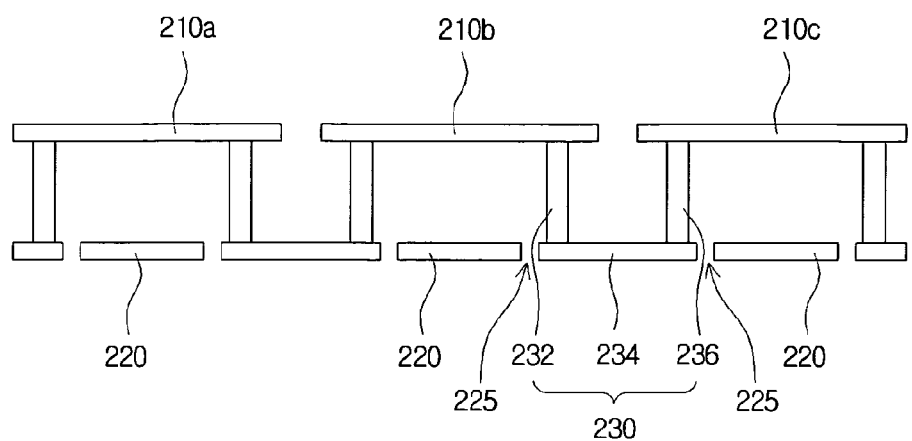
FIG. 15 is a sectional view showing the electromagnetic bandgap structure of FIG. 14.
Figure 16:
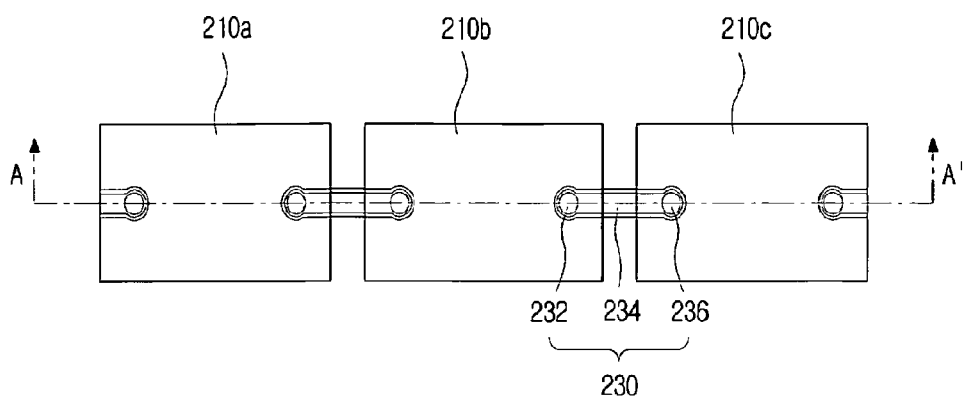
FIG. 16 is a plan view showing a configuration of the electromagnetic bandgap structure of FIG. 14.

FIG. 14 is a 3-D perspective view showing an electromagnetic bandgap structure in accordance with another embodiment of the present invention. FIG. 15 is a sectional view showing the electromagnetic bandgap structure of FIG. 14, and FIG. 16 is a plan view showing a configuration of the electromagnetic bandgap structure of FIG. 14. Particularly, FIG. 15 show a section viewed along the AA' line of FIG. 14.

As shown in FIG. 14 through FIG. 16, the electromagnetic bandgap structure in accordance with another embodiment of the present invention can include a plurality of metal plates 210a, 210b and 210c, a metal layer 220 placed on a planar surface that is different from a planar surface in which the metal plates 210a, 210b and 210c are placed and a stitching via 230 electrically connecting two adjacent metal plates among the metal plates.

In other words, the electromagnetic bandgap structure 200 shown in FIG. 14 through FIG. 16 can basically include a two-layered planar structure having a first layer in which the metal layer 220 is placed and a second layer in which the plurality of metal plates 210a, 210b and 210c are placed. A dielectric layer can be interposed between the metal layer 220 and the plurality of metal plates 210a, 210b and 210c.

Figure 18:
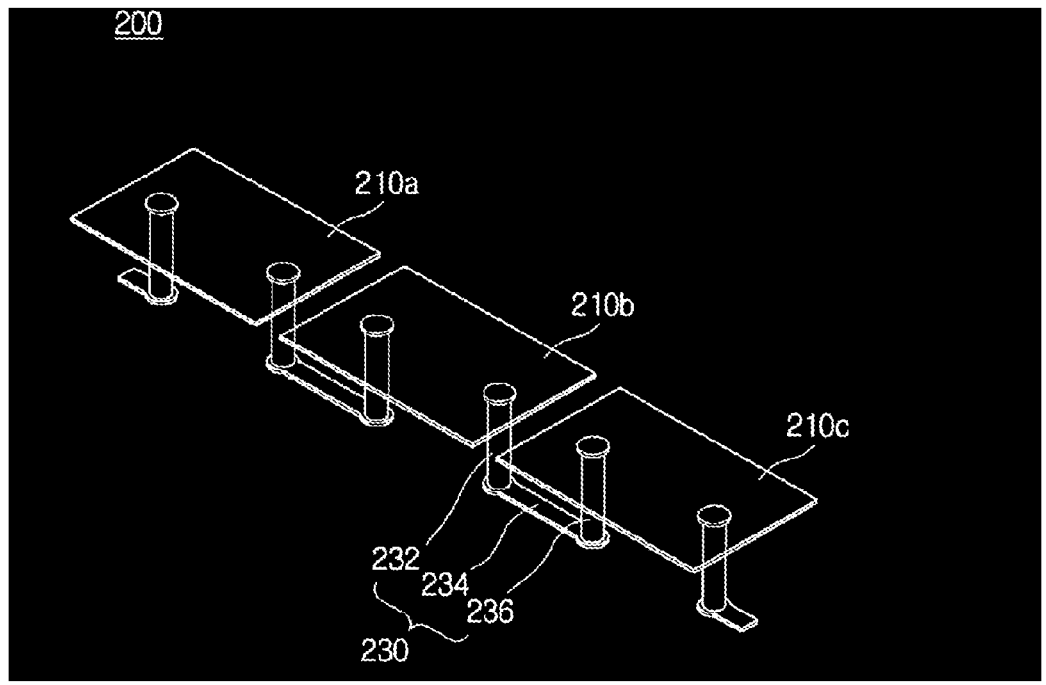
FIG. 18 is a 3-D perspective view showing an electromagnetic bandgap structure in accordance with another embodiment of the present invention.
Figure 19:
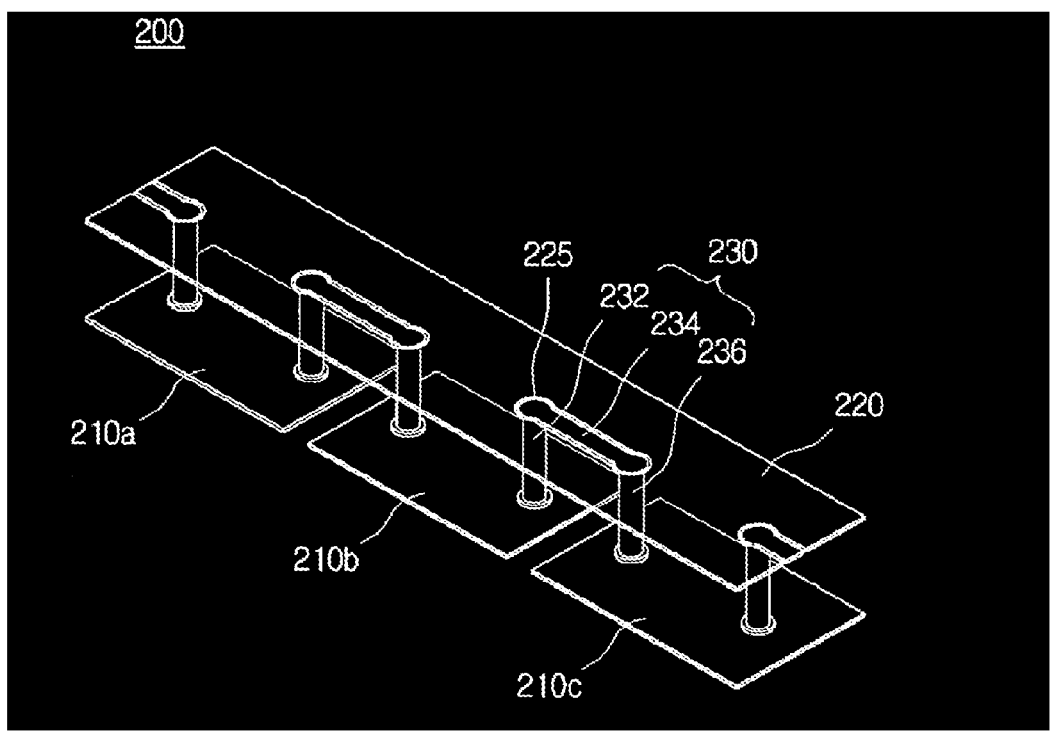
FIG. 19 is a 3-D perspective view showing an electromagnetic bandgap structure in accordance with another embodiment of the present invention.
Figure 20:
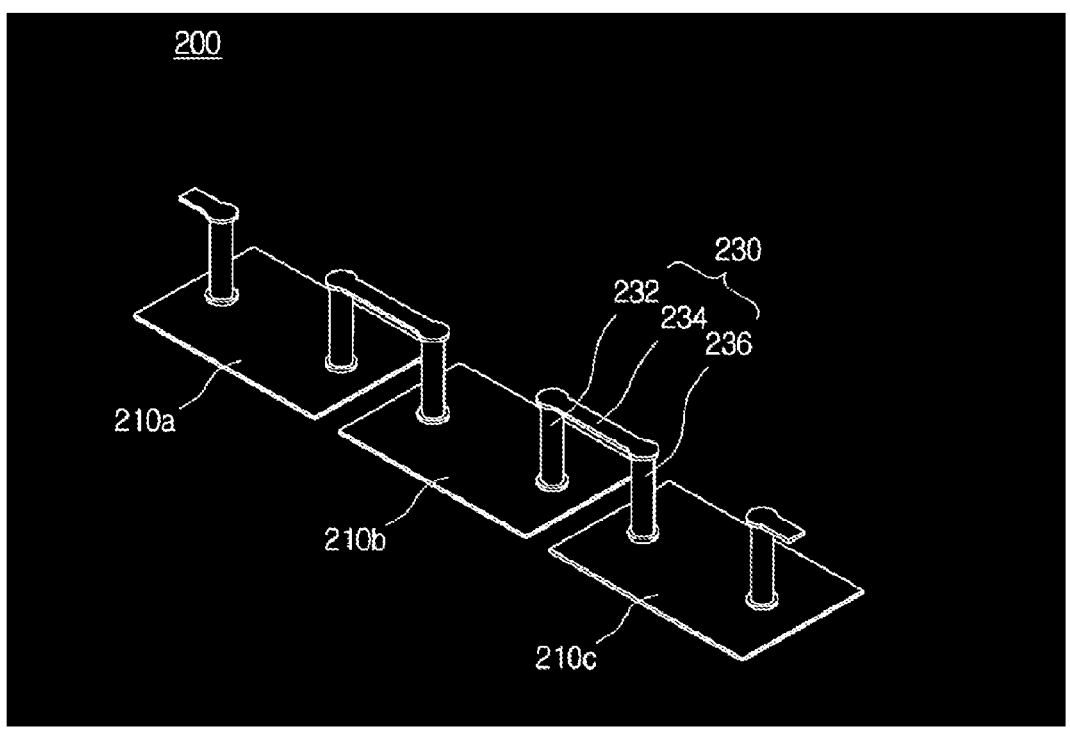
FIG. 20 is a 3-D perspective view showing an electromagnetic bandgap structure in accordance with another embodiment of the present invention.

Here, FIG. 14 through FIG. 16 merely show elements constituting the electromagnetic bandgap structure (i.e. a part constituting the 2-layered electromagnetic bandgap including the stitching via) for the convenience of illustration (also, in the case of FIG. 18 through FIG. 20). Accordingly, the first layer in which the metal layer 220 shown in FIG. 14 through FIG. 16 is placed and the second layer in which the plurality of metal plates 210a, 210b and 210c shown in FIG. 14 through FIG. 16 are placed may be any two layers of a multi-layered printed circuit board.

In other words, it shall be obvious that there can be at least one additional metal layer below the metal layer 220, above the metal plates 210a, 210b and 210c and/or between the metal layer 220 and the metal plates 210a, 210b and 210c.

For example, the electromagnetic bandgap structure 200 shown in FIG. 14 through FIG. 16 can be placed between any two metal layers functioning as a power layer and a ground layer, respectively, in a multi-layered printed circuit board, in order to block a conductive noise (the same can be applied to electromagnetic bandgap structures shown in FIG. 18 to FIG. 20 in accordance with another embodiments of the present invention).

Since the conductive noise problem is not limited to the space between the power layer and the ground layer, the electromagnetic bandgap structure shown in FIG. 14 through FIG. 20 can be placed between any two ground layers or power layers placed on different layers from each other in a multi-layered printed circuit board.

The metal plates 210a, 210b and 210c can be spaced from each other at a predetermined distance on the same planar surface. Here, the metal layer 220 and the metal plates 210a, 210b and 210c can be a material (e.g. copper (Cu)) to which power can be supplied and a signal can be transmitted.

The stitching via 230 can electrically connect two adjacent metal plates (e.g. the metal plates 210b and 210c in FIG. 14). However, the two metal plates 210b and 210c are connected not on the same layer in which the metal plates 210b and 210c are placed but through another layer (e.g. the metal layer 220) that is different from the layer in which the metal plates 210b and 210c are placed.

The stitching via 230 can be formed to include a first via 232, a connection pattern 234 and a second via 236. The first via 232 can include one end part, connected to the first metal plate 210b, and the other end part, connected to one end part of the connection pattern 234. The second via 236 can include one end part, connected to the second metal plate 210c, and the other end part, connected to the other end part of the connection pattern 234. A via land for being connected to the first via 232 and/or the second via 236 can be formed on either end part of the connection pattern 234.

It shall be evident here that, in order to allow the metal plates to be electrically connected to each other, it is necessary that a plating layer be formed on an inner wall only of the first via 232 and the second via 236 of the stitching via 230 or the inside of the stitching via 230 be filled with a conductive material (e.g. conductive paste), and the connection pattern 234 be a conductive material such as a metal.

The two adjacent metal plates 210b and 210c can be connected in series through the stitching via 230. In particular, the two adjacent metal plates 210b and 210c can be electrically connected in series in the order of the first metal plate 210b→the stitching via 230 (the first via 232→the connection pattern 234→the second via 236)→the second metal plate 210b.

The first metal plate 210b can be connected to the other metal plate 210a through the stitching via 230. The second metal plate 210c can also be connected to another metal plate (not shown) through the stitching via 230. As a result, all metal plates, placed on the second layer, can be connected in series through the stitching via 230.

The metal layer 220 can be formed with a clearance hole 225 accommodating the connection pattern 234. The clearance hole 225 can also accommodate the via land for easy connection with the first via 232 and/or the second via 236 as well as the connection pattern 234. The clearance hole 225 can allow the stitching via 230 and the metal layer 220 to be electrically disconnected from each other.

Connecting the metal plates 210a, 210b and 210c through the stitching via 230 can make it unnecessary to form a pattern for connecting the metal plates 210a, 210b and 210c on the second layer. This can make the metal plates 210a, 210b and 210c smaller and the gap between the metal plates 210a, 210b and 210c narrower, increasing the capacitance in the gaps between the metal plates 210a, 210b and 210c.

Figure 17:
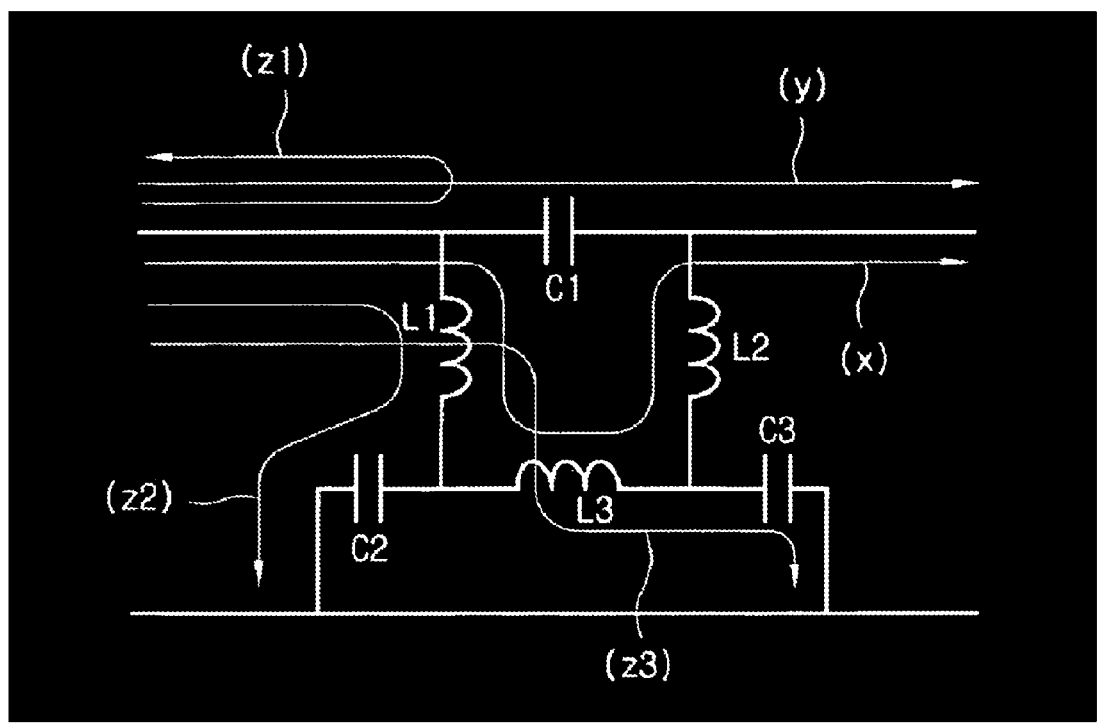
FIG. 17 shows an equivalent circuit of the electromagnetic bandgap structure of FIG. 14.

FIG. 17 shows an equivalent circuit of an electromagnetic bandgap structure having the above structure.

Comparing the equivalent circuit of FIG. 15 with the electromagnetic bandgap structure of FIG. 14, an inductance component L1 can correspond to the fist via 232, and an inductance component L2 can correspond to the second via 236. An inductance component L3 can correspond to the connection pattern 234. C1 can be a capacitance component by the metal plates 210a and 210b and another dielectric layer and another metal layer to be placed above the metal plates 210a and 210b. C2 and C3 can be capacitance components by the metal layer 220 placed on the same planar surface as that of the connection pattern 234 and another dielectric layer and another metal layer to be placed below the planar surface of the connection pattern 234.

The electromagnetic bandgap structure shown in FIG. 14 through FIG. 16 can function as a band stop filter, which blocks a signal of a certain frequency band according to the above equivalent circuit. In other words, as seen in the equivalent circuit of FIG. 15, a signal x of a low frequency band (refer to FIG. 17) and a signal y of a high frequency band (refer to FIG. 17) can pass through the electromagnetic bandgap structure, and signals z1, z2 and z3 of a certain frequency band (refer to FIG. 17) ranging between the low frequency band and the high frequency band are blocked by the electromagnetic bandgap structure.

In accordance with another embodiment of the present invention, the metal plates 210a, 210b and 210c can be placed on a planar surface in which another metal layer that is different from the metal layer 220 is placed. The metal plate 210a placed at a far left side, therefore, can be connected to the other metal layer that is different from the metal layer 220 through a stitching via, in accordance with the present invention.

If the metal layer 220 is a power layer, the different metal layer can be a ground layer, and if the metal layer 220 is a ground layer, the different metal layer can be a power layer.

Alternatively, a signal can be transferred in a predetermined direction by allowing the metal layer 220 to be the ground layer and the other metal layer to be a signal layer, and the noise of a certain frequency of the signal can be reduced by allowing the mentioned metal plates 210a, 210b and 210c and the stitching via 230 to be arranged on some areas of a signal transfer path of the signal layer.

As shown in FIG. 14 through FIG. 16, the metal plates 210a, 210b and 210c can be arranged in one row, and two stitching vias can be connected to each of the metal plates 210a, 210b and 210c. However, in accordance with another embodiment of the present invention, a metal plate can be arranged in a matrix of m*n, m and n being natural numbers, and its adjacent metal plates can be connected by using the stitching via. In this case, each metal plate can function as a path connecting its adjacent other metal plates and be connected to at least two stitching vias.

In other words, the connection form shown in FIG. 14 through FIG. 16 is merely an example, and as long as all metal plates can form a closed loop by being electrically connected to each other, any method of connecting the metal plates through the stitching via can be used.

Hereinafter, some electromagnetic bandgap structures in accordance with another embodiments of the present invention will be described in turn with reference to FIG. 18 through FIG. 20. Any matter already described in FIG. 14 through FIG. 16 will be not be redundantly described, and the electromagnetic bandgap structures will be briefly described based on the features of each embodiment of the present invention. This is because the same technological principle as described in FIG. 14 through FIG. 16 is applied to the electromagnetic bandgap structures of FIG. 18 through FIG. 20 in accordance with another embodiments of the present invention, except for some differences.

Accordingly, in FIG. 18 through FIG. 20, each corresponding element is assigned the identical reference numeral as in FIG. 14 through FIG. 16, for easy comparison.

As shown in FIG. 18, the electromagnetic bandgap structure in accordance with another embodiment of the present invention can include a plurality of metal plates 210a, 210b and 210c and a stitching via 230 electrically connecting two adjacent metal plates of the metal plates 210a, 210b and 210c to each other. In other words, the electromagnetic bandgap structure of FIG. 18 does not have a metal layer corresponding to the metal layer 220 shown in FIG. 14 through FIG. 15.

As such, it is not always necessary that the electromagnetic bandgap structure having a stitching via in accordance with another embodiment of the present invention include a metal layer below an area in which the stitching via and metal plates are placed. This is because it is not necessary that the connection pattern 234 of the stitching via 230 be formed on an area in which the metal layer is placed.

In other words, if there is a metal layer on the same planar surface to correspond to an area in which the connection pattern 234 will be placed, the connection pattern 234 can be manufactured in the form of being accommodated into the clearance hole 225 formed in the metal layer 220 on the same planar surface, as shown in FIG. 14 through FIG. 16. However, no additional metal layer may be placed in the area in which the connection pattern 234 will be placed, as shown in FIG. 18. Of course, there may be a dielectric layer below the metal plates in FIG. 18.

As shown in FIG. 19, the electromagnetic bandgap structure in accordance with another embodiment of the present invention can have a stacked structure, with the position of the upper layer and the lower layer inversed from that of FIG. 14 through FIG. 16.

In other words, while the electromagnetic bandgap structure shown in FIG. 14 through FIG. 16 has the metal layer 220 forming a lower layer, the metal plates 210a, 210b and 210c forming an upper layer and the dielectric layer interposed between the lower layer and the upper layer, the electromagnetic bandgap structure shown in FIG. 19 can inversely have the metal layer 220 forming the upper layer, the metal plates 210a, 210b and 210c forming the lower layer and the dielectric layer interposed between the lower layer and the upper layer. Of course, it can be expected that the electromagnetic bandgap structure shown in FIG. 19 has the identical or similar noise blocking effect to that of FIG. 14 through FIG. 16.

As shown in FIG. 20, the electromagnetic bandgap structure in accordance with another embodiment of the present invention can have the same structure of the electromagnetic bandgap structure shown in FIG. 19 without the metal layer 220. This reason, already described above with reference to FIG. 18, will be omitted.

As such, the electromagnetic bandgap structure in accordance with the present invention can have various types of stacked structures. Although all of the foresaid drawings show that all metal plates are stacked in the same planar surface, it is not always necessary that all metal plates are stacked in the same planar surface.

In case at least one of the metal plates is stacked in a planar surface that is different from the planar surface in which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

The aforementioned drawings also show that each stitching via electrically connects two adjacent metal plates to each other. However, it may be unnecessary that two plates connected by the stitching via are adjacent to each other.

Even though one metal plate is shown to be connected to another metal plate through one stitching via, it is obviously unnecessary that the electromagnetic bandgap structure has any limitation to the number of the stitching vias connecting any two metal plates.

For the convenience of illustration and understanding of the invention, in FIG. 14 through FIG. 20, only three metal plates are shown, and one metal plate is electrically connected to another adjacent metal plate and yet another adjacent metal plate through one stitching via each (i.e. two adjacent cells around one cell are connected).

In addition, the organic titanium coating layer formed on outer surfaces of the metal plates may be further included.

As described hereinbefore, the present invention provides a PCB including an electromagnetic bandgap structure. According to the present invention, the electromagnetic bandgap structure is disposed between the circuit chip and the antenna, thus efficiently reducing unnecessary signal interference.

Also, according to the present invention, there is no need for additional change in antenna design in order to block noise, thus shortening the lead time.

Also, according to the present invention, as the lead time is shortened, additional costs do not occur.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board, comprising:
   an antenna;
   a circuit chip;
   a plurality of metal layers and a plurality of dielectric layers;
   a pair of transmission lines for transmitting a signal to the antenna; and
   an electromagnetic bandgap structure disposed between the antenna and the circuit chip in the printed circuit board and for preventing an electromagnetic wave from being transmitted from the circuit chip to the antenna,
   wherein one of the pair of transmission lines is formed in a first metal layer of the plurality of metal layers so as to transmit the signal to the antenna, and the electromagnetic bandgap structure comprises a plurality of metal plates spaced apart from the one of the pair of transmission lines in a direction of the antenna; and a plurality of vias for connecting the one of the pair of transmission lines and the metal plates to each other, in which sets of the metal plates and the vias are periodically arranged at a predetermined interval, and
   wherein the other of the pair of transmission lines is formed in a second metal layer of the plurality of metal layers which is spaced apart from the first metal layer in a direction of the antenna, and the metal plates are formed in the second metal layer.

2. The printed circuit board as set forth in claim 1, wherein the circuit chip is an analog circuit chip for transmitting the signal to the antenna, and the electromagnetic wave transmitted from the circuit chip to the antenna is an electromagnetic wave caused by an operating frequency and harmonic components of the circuit chip.

3. The printed circuit board as set forth in claim 1, wherein the circuit chip is a digital circuit chip, and the electromagnetic wave transmitted from the circuit chip to the antenna is an electromagnetic wave caused by an operating frequency and harmonic components of the circuit chip.

4. The printed circuit board as set forth in claim 1, wherein the one of the pair of transmission lines is a ground plate, and the other of the pair of transmission lines is a feed line.

5. The printed circuit board as set forth in claim 1, further comprising an organic titanium coating layer formed on an outer surface of each of the metal plates.

6. The printed circuit board as set forth in claim 1, wherein a pad for electrically connecting the antenna and the transmission line to each other is provided at a surface of the antenna, and the plurality of metal plates of the electromagnetic bandgap structure are periodically arranged so as to enclose the pad.

7. A printed circuit board, comprising:
an antenna;
a circuit chip;
a plurality of metal layers and a plurality of dielectric layers;
a pair of transmission lines for transmitting a signal to the antenna; and
an electromagnetic bandgap structure disposed between the antenna and the circuit chip in the printed circuit board and for preventing an electromagnetic wave from being transmitted from the circuit chip to the antenna,
wherein one of the pair of transmission lines is formed in a first metal layer of the plurality of metal layers so as to transmit the signal to the antenna, and the electromagnetic bandgap structure comprises a plurality of metal plates spaced apart from the one of the pair of transmission lines in a direction of the antenna; and a plurality of vias for connecting the one of the pair of transmission lines and the metal plates to each other, in which sets of the metal plates and the vias are periodically arranged at a predetermined interval, and
wherein the other of the pair of transmission lines is formed around the one of the pair of transmission lines on the first metal layer.

8. The printed circuit board as set forth in claim 7, wherein the one of the pair of transmission lines is a feed line, and the other of the pair of transmission lines is a ground plate.

* * * * *